(12) United States Patent
Tang

(10) Patent No.: US 12,349,342 B2
(45) Date of Patent: Jul. 1, 2025

(54) SEMICONDUCTOR STRUCTURE AND METHOD FOR MANUFACTURING SAME, MEMORY AND OPERATION METHOD THEREOF

(71) Applicant: CHANGXIN MEMORY TECHNOLOGIES, INC., Hefei (CN)

(72) Inventor: Yanzhe Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 366 days.

(21) Appl. No.: 17/899,145

(22) Filed: Aug. 30, 2022

(65) Prior Publication Data

US 2023/0422492 A1    Dec. 28, 2023

Related U.S. Application Data

(63) Continuation of application No. PCT/CN2022/103663, filed on Jul. 4, 2022.

(30) Foreign Application Priority Data

Jun. 24, 2022   (CN) .......................... 202210728734.6

(51) Int. Cl.
*H10B 20/25* (2023.01)
*G11C 17/16* (2006.01)
*G11C 17/18* (2006.01)

(52) U.S. Cl.
CPC ............. *H10B 20/25* (2023.02); *G11C 17/16* (2013.01); *G11C 17/18* (2013.01)

(58) Field of Classification Search
CPC .......... G11C 17/16; G11C 17/18; H10B 20/25
(Continued)

(56) References Cited

U.S. PATENT DOCUMENTS

| 7,923,813 B2 | 4/2011 | Van Der Sluis |
| 2003/0198109 A1* | 10/2003 | Sakoh ................... G11C 17/16 257/E27.097 |

(Continued)

FOREIGN PATENT DOCUMENTS

| CN | 101162720 A | 4/2008 |
| CN | 101180684 A | 5/2008 |

(Continued)

OTHER PUBLICATIONS

Korean Intellectual Property Office, Office Action Issued in Application No. 10-2022-7042880, May 21, 2024, 17 pages.

(Continued)

*Primary Examiner* — Muna A Techane
(74) *Attorney, Agent, or Firm* — Kilpatrick Townsend & Stockton LLP

(57) ABSTRACT

Provided is a semiconductor structure and a method for manufacturing the same, a memory and a method for operating the same. The semiconductor includes a substrate having a plurality of active areas close to a surface of the substrate; a gate structure located in a first structure layer on the substrate, in which the gate structure and the active areas constitute a selective transistor; and an anti-fuse bit structure located in a second structure layer on the first structure layer, and connected with an active area of one selective transistor through a first connecting structure, in which a breakdown state and a non-breakdown state of the anti-fuse bit structure represent different stored data.

17 Claims, 19 Drawing Sheets

(58) Field of Classification Search
USPC .......................................................... 365/96
See application file for complete search history.

(56) References Cited

U.S. PATENT DOCUMENTS

| | | | | |
|---|---|---|---|---|
| 2004/0232446 | A1* | 11/2004 | Nishimura | G01R 31/31713 257/202 |
| 2009/0072212 | A1 | 3/2009 | Van Der Sluis | |
| 2010/0276742 | A1 | 11/2010 | Voshell | |
| 2014/0346603 | A1 | 11/2014 | Toh et al. | |
| 2015/0062998 | A1 | 3/2015 | Nam | |
| 2015/0171094 | A1* | 6/2015 | Hofmann | G11C 17/16 257/379 |
| 2015/0287730 | A1* | 10/2015 | Wu | H10B 41/35 365/96 |
| 2017/0032848 | A1 | 2/2017 | Chung | |
| 2017/0179131 | A1* | 6/2017 | Lin | H01L 27/0207 |
| 2017/0179138 | A1* | 6/2017 | Hsu | H10B 20/20 |
| 2018/0061755 | A1 | 3/2018 | Yamamoto et al. | |
| 2019/0304989 | A1* | 10/2019 | Chao | H10B 10/12 |
| 2020/0135746 | A1* | 4/2020 | Liaw | H01L 23/5252 |
| 2020/0402985 | A1 | 12/2020 | Liaw | |
| 2022/0181337 | A1* | 6/2022 | Huang | H01L 27/0207 |

FOREIGN PATENT DOCUMENTS

| | | |
|---|---|---|
| CN | 104425513 A | 3/2015 |
| CN | 209785927 U | 12/2019 |
| CN | 113764379 A | 12/2021 |
| CN | 114429991 A | 5/2022 |
| JP | H0246764 A | 2/1990 |
| JP | H0883497 A | 3/1996 |
| JP | 2000123593 A | 4/2000 |
| JP | 2002057306 A | 2/2002 |
| KR | 20030082910 A | 10/2003 |

OTHER PUBLICATIONS

First Office Action of the Taiwanese application No. 111140064, issued on Aug. 11, 2023. 7 pages with English abstract.
Anonymous: "Antifuse—Wikipedia", May 5, 2014 (May 5, 2014), XP093090727, Retrieved from the Internet: URL: https://en.wikipedia.org/w/index.php?title=Antifuse&oldid=607153188, [retrieved on Oct. 11, 2023], first paragraph; p. 1. 4 pages.
Supplementary European Search Report in the European application No. 22764636.1, mailed on Oct. 30, 2023. 14 pages.
Japanese Patent Office, Office Action Issued in Application No. 2022-562580, Aug. 6, 2024, 11 pages.
Japanese Patent Office, Office Action Issued in Application No. 2022-562580, Dec. 17, 2024, 10 pages.

* cited by examiner

SEMICONDUCTOR STRUCTURE AND METHOD FOR MANUFACTURING SAME, MEMORY AND OPERATION METHOD THEREOF

CROSS-REFERENCE TO RELATED APPLICATIONS

This application is a continuation application of International Application No. PCT/CN2022/103663, filed on Jul. 4, 2022, which claims priority to Chinese Patent Application No. 202210728734.6, filed on Jun. 24, 2022. The disclosures of the applications are hereby incorporated by reference in their entirety.

BACKGROUND

With the continuous development of science and technology, the performance of semiconductor memory devices is becoming more and more powerful, while the feature size is becoming smaller and smaller. Herein, one time programmable (OTP) memory is a kind of non-volatile memory (NVM), which can still keep the stored data even when the power supply is shut down. The one-time programmable memory can only be programmed once, and cannot be erased electrically. It can be applied to program memory, serial configuration memory and system-on-chip (SOC), and plays a role in ID identification, memory repair and the like.

At present, the one-time programmable memory mainly adopts the similar structure of dynamic random access memory (DRAM), which includes a selective transistor and a breakdownable capacitor (ITIC). Since the breakdown of the dielectric layer in the capacitor is irreversible, the solidified storage data can be obtained by reading the breakdown state of the capacitor. However, one time programmable memory faces problems, such as large storage area, low integration, complex manufacturing process, high manufacturing cost, and so on.

SUMMARY

The disclosure relates to the technical field of semiconductor, and relates to but is not limited to, a semiconductor structure and a method for manufacturing the same, a memory and an operation method thereof.

Embodiments of the disclosure provide a semiconductor structure and a method for manufacturing the same, and a memory and a method for operating the same.

In the first aspect-, embodiments of the disclosure provide a semiconductor structure including a substrate, a gate structure and an anti-fuse bit structure.

The substrate has a plurality of active areas close to a surface of the substrate. The gate structure is located in a first structure layer on the substrate. The gate structure and the active areas constitute a selective transistor. The anti-fuse bit structure is located in a second structure layer on the first structure layer, and is connected with an active area of the selective transistor through a first connecting structure. A breakdown state and a non-breakdown state of the anti-fuse bit structure represent different stored data.

In the second aspect, the embodiments of the disclosure provide a method for manufacturing a semiconductor structure including: providing a substrate having a plurality of active areas close to a surface of the substrate; forming a first structure layer comprising a gate structure on the substrate, where the gate structure and the active areas below the gate structure constitute a selective transistor: and forming a second structure layer comprising an anti-fuse bit structure on the first structure layer, and forming a first connecting structure connecting the anti-fuse bit structure and an active area of the selective transistor, in which a breakdown state and a non-breakdown state of the anti-fuse bit structure represent different stored data.

In the third aspect, embodiments of the disclosure further provide a method for operating a memory including the semiconductor structure as described in any of the above-described embodiments of the disclosure, and the method includes: breaking down a target anti-fuse bit structure of the anti-fuse bit structures of the memory according to data to be written to convert the target anti-fuse bit structure from a non-breakdown state to a breakdown state; and maintaining a non-breakdown state of a non-target anti-fuse bit structure, in which, the non-target anti-fuse bit structure is an anti-fuse bit structure other than the target anti-fuse bit structure.

In the fourth aspect, embodiments of the disclosure provide a memory, which includes a memory array, in which the semiconductor structure as described in any of the above-described embodiments is included; and a peripheral circuit coupled to the memory array.

DETAILED DESCRIPTION

Figure 1:
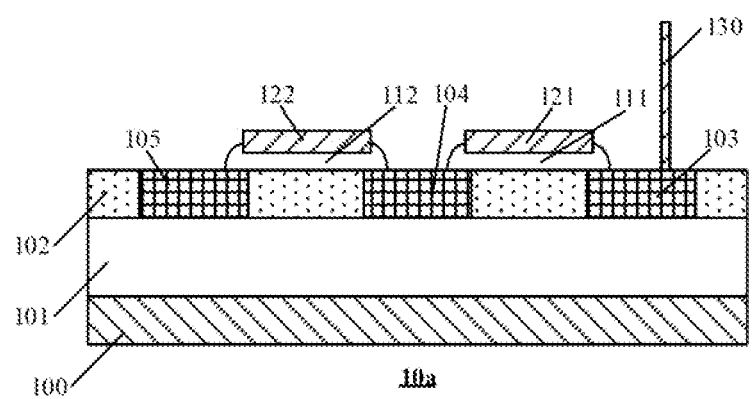
FIG. 1 is a schematic diagram of a semiconductor structure provided by an embodiment of the disclosure.

For facilitating to understand the disclosure, exemplary embodiments of the disclosure will be described in more details below with reference to the accompanying drawings. Although exemplary embodiments of the present disclosure are shown in the drawings, it should be understood that the present disclosure may be implemented in various forms and should not be limited to the specific embodiments set forth herein. These embodiments are provided for the purpose that the disclosure will be more thoroughly understood and the scope of the disclosure will be fully conveyed to those skilled in the art.

In the description below, numerous specific details are given for thorough understanding of the disclosure. However it will be apparent to those skilled in the art that the disclosure may be implemented without one or more of these details. In some embodiments, some technical features well-known in the art are not described in order to avoid confusion with the present disclosure; that is, not all of the features of actual embodiments are described herein, and well-known functions and structures are not described in detail.

In general, terms can be understood at least in part from their use in context. For example, depending at least in part on the context, the term "one or more" as used herein may be used to describe any feature, structure, or characteristic in a singular sense, or may be used to describe a combination of features, structures, or characteristics in a singular sense. Similarly, terms such as "one" or "said" may likewise be understood as conveying singular usage or conveying plural usage, depending at least in part on the context, hi addition, the term "based on" may be understood as not necessarily intended to convey an exclusive set of factors, and may alternatively allow the existence of additional factors that are not necessarily explicitly described, which also depends at least in part on the context.

Unless otherwise defined, the terms used herein are intended to describe specific embodiments only and are not to be a limitation to the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

In order to thoroughly understand the present disclosure, detailed operations and structures will be set forth in the following description in order to illustrate the technical solution of the present disclosure. Preferred embodiments of the present disclosure are described in detail below. However the present disclosure may have other embodiments in addition to these detailed descriptions.

Figure 2:
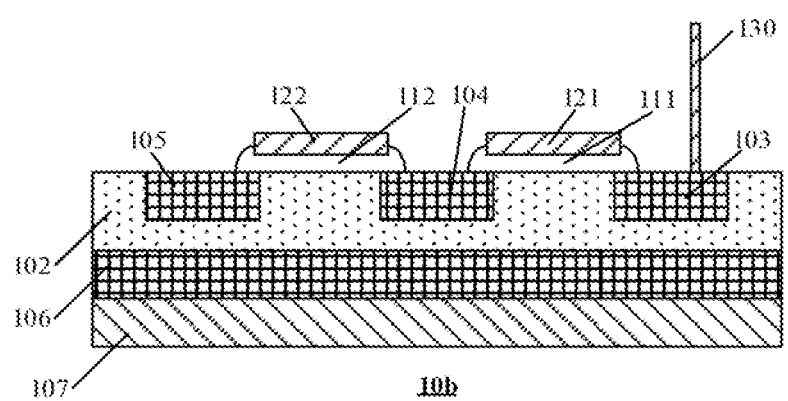
FIG. 2 is a schematic diagram of a semiconductor structure provided by an embodiment of the disclosure.

In some embodiments, as shown in FIGS. 1 and 2, a semiconductor structure 10a and a semiconductor structure 10b having an anti-fuse bit structure are provided respectively. The semiconductor structures 10a and 10b are used for a one-time programmable memory. Herein, the semiconductor structure 10a includes: a base 100, an insulating layer 101 and a P-type semiconductor layer 102.

The insulating layer 101 is located on the base 100. The P-type semiconductor layer 102 is located on the insulating layer 101, A first doped region 103, a second doped region 104 and a third doped region 105 are all located in the P-type semiconductor layer 102, in which the first doped region 103, the second doped region 104 and the third doped region 105 may be N-type doped regions, and the first doped region 103 is connected to a first metal line 130, which may be a bit line (BL.

A first gate dielectric 111 is located on the P-type semiconductor layer 102 between the first doped region 103 and the second doped region 104. A first gate 121 located on the first gate dielectric 111, in which the first gate 121 may be a word line (WL).

A second gate dielectric 112 is located on the P-type semiconductor layer 102 between the second doped region 104 and the third doped region 105, in which the second gate dielectric 112 may be an anti-fuse bit dielectric layer, A breakdown state and a non-breakdown state of the second gate dielectric 112 may be used to represent different stored data, i.e. "0" or "1", A second gate 122 is located on the second gate dielectric 112.

It should be noted that, in order to illustrate each structure clearly in the figure, the proportional relationship of the dimension of each structure may not be consistent with the actual structure. In this way, the first doped region 103, the second doped region 104, the first gate dielectric 111 and the first gate 121 constitute a selective transistor. The second doped region 104, the third doped region 105, the second gate dielectric 112 and the second gate 122 constitute an anti-fuse bit structure. One selective transistor and one anti-fuse bit structure constitute a memory cell.

In some embodiments, as shown in FIG. 2, the thickness of the P-type semiconductor layer 102 in the semiconductor structure 10b may be greater than the depth of each doped region; and the semiconductor structure 10b further includes a deep N-well (DNXW) 106 and a P-type base 107 located below the deep N-well 106. In this way, inversely biased junctions can be formed between the P-type semiconductor layer 102 and the deep N-well 106, and between the deep N-well 106 and the P-type base 107, so as to replace the insulating layer 101 in the semiconductor structure 10a to perform an electrical isolation function.

Therefore, the turn-on and turn-off of the selective transistor can be controlled by the first gate 121, When the selective transistor is turned on, the voltage applied on the first metal line 130 may be transferred to the second doped region 104 through the channel of the selective transistor. At this time, the voltage difference between the second gate 122 and the second doped region 104 may be greater than or equal to the breakdown voltage of the second gate dielectric 112, so that the second gate dielectric 112 is permanently broken down to complete the writing operation of the memory cell. It could be understood that the third doped region 105 is in a floating state during the writing operation.

In some embodiments, the first doped region 103, the second doped region 104 and the third doped region 105 may be N-type doped regions with a high doping concentration, i.e. N+-type doped regions. The first gate dielectric 111 and the second gate dielectric 112 may be a relatively thinner oxide layer so as to reduce the occupied area of the memory cell. The second gate dielectric 112 is more easily broken down, thereby meeting the requirement of low power consumption of the memory.

It could be understood that, in the semiconductor structures 10a and 10b, a selective transistor and an anti-fuse bit structure are located in adjacent positions in the horizontal direction, thus occupying a larger area in the horizontal direction, so that the size of the memory cell is large, and the integration of the memory is low.

Figure 3:
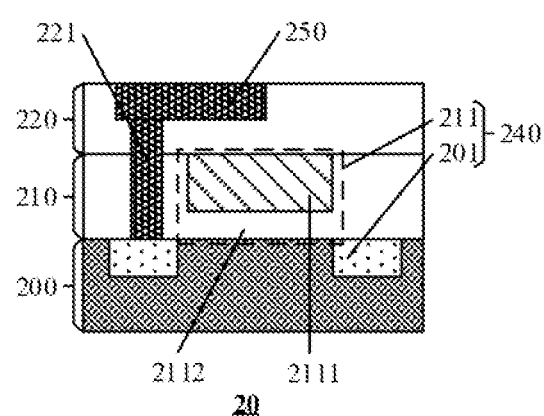
FIG. 3 is a schematic diagram of another semiconductor structure provided by an embodiment of the disclosure.

As shown in FIG. 3, embodiments of the disclosure provide a semiconductor structure 20, which includes a substrate 200, the substrate 200 having a plurality of active areas 201 close to a surface of the substrate 200; a gate structure 211 located in a first structure layer 210 on the substrate 200, and the gate structure 211 and the active areas 201 forming a selective transistor 240; and an anti-fuse bit structure 250 located in a second structure layer 220 on the first structure layer 210, and the anti-fuse bit structure 250 is connected with the active area 201 of one selective transistor 240 through a first connecting structure 221, in which a breakdown state and a non-breakdown state of the anti-fuse bit structure 250 are used to represent different stored data.

In embodiments of the disclosure, the material of the substrate 200 may include an elemental semiconductor material, such as silicon (Si), germanium (Ge), or the like, or a compound semiconductor material, such as gallium nitride (GaN), gallium arsenide (GaAs), indium phosphide (InP), or the like. In some embodiments, the substrate 200 may also have well regions, such as a P-well and a deep N-well beneath the P-well. The P-well may be used to form active areas 201 of the selective transistor 240, while the deep N-well may be used to isolate the P-well and reduce the noise interference to devices formed in the P-well. The active areas 201 may be doped regions in the substrate 200, and the doping types of a plurality of active areas 201 may be the same. The impurity ions doped in the P-type doped region may be trivalent elements, such as boron or the like; and the impurity ions doped in the N-type doped region may be pentavalent elements, such as phosphorus, arsenic or the like. For example, the active areas 201 may be N+-type doped regions in the P-well for constituting the source and the drain of the selective transistor 240.

In embodiments of the disclosure, a first structure layer 210 is provided on the substrate 200, and the first structure layer 210 includes a gate structure 211, and the gate structure 211 and the active areas 201 below the gate structure 211 constitute a selective transistor 240. The gate structure 211 may also include a gate electrode 2111 and a gate dielectric 2112, in which the gate electrode 2111 may be a word line in a memory. The material of the gate electrode 2111 may be a conductive material such as a metal, a doped semiconductor or the like. The gate dielectric 2112 may be located in the side of the first structure layer 210 near the substrate 200 and may be a material such as silicon oxide, hafnium oxide or the like. It could be understood that other structures not shown in FIG. 3 may also be included in the first structure layer 210.

In embodiments of the disclosure, a second structure layer 220 is provided on the first structure layer 210. The second structure layer 220 includes an anti-fuse bit structure 250, which may be a capacitor structure that can be broken down. The anti-fuse bit structure 250 is connected to the active area 201 of at least one selective transistor 240 through a first connecting structure 221. The first connecting structure penetrates the first structure layer 210. The material of the first connecting structure 221 may include a conductive material, such as a metal, a doped semiconductor, or the like. In some embodiments, the anti-fuse bit structure 250 may include two electrodes located in the same plane and an anti-fuse bit dielectric layer located between the two electrodes. For example, the two electrodes above-mentioned may be a conductive material and the anti-fuse bit dielectric layer may be silicon oxide or the like. A breakdown state and a non-breakdown state of the anti-fuse bit structure 250 are used to represent different stored data, i.e. "0" or "1", It could be understood that other structures not shown in FIG. 3 may also be included in the second structure layer 220.

In some embodiments, one selective transistor 240 and one anti-fuse bit structure 250 constitute a memory cell of a one-time programmable memory. The gate structure 211 connects to a plurality of memory cells located in its extension direction. The turn-on and turn-off of a selective transistor 240 can be controlled by applying different voltages to the first gate 211. In some embodiments, one end of the selective transistor 240 is also connected to a bit line. When the selective transistor 240 is turned on, a voltage of the bit line may be applied to one electrode of the anti-fuse bit structure 250, at this time, a suitable voltage is applied to the other electrode, so that the voltage difference between the two electrodes of the anti-fuse bit structure 250 is greater than or equal to the breakdown voltage of the anti-fuse bit dielectric layer, and then the anti-fuse bit structure 250 is permanently brokendown and the one-time programming operation of the memory cell is completed.

Since the anti-fuse bit structure 250 is located in the second structure layer 220 above the first structure layer 210, that is, the anti-fuse bit structure 250 is located above the selective transistor 240, in this way, the anti-fuse bit structure 250 does not need to occupy an additional area in the horizontal direction, so that the size of the memory cell is small and the integration of the memory is improved. Furthermore, the two electrodes of the anti-fuse bit structure 250 may be formed simultaneously in the second structure layer 220, fewer mask processes are needed, thereby simplifying the manufacturing process. On the other hand, since the gate structure 211 is located in the first structure layer 210, the gate dielectric 2112 of the gate structure 211 can be made thicker, so that the programming voltage of the selective transistor 240 is more stable, and the gate dielectric 2112 is not easily brokendown by a mistake, thereby improving the reliability of the memory.

Figure 4:
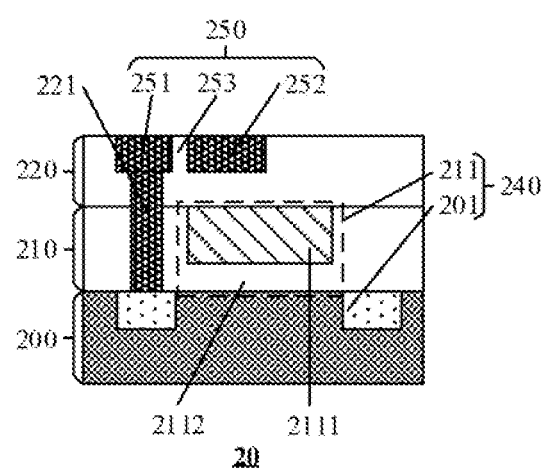
FIG. 4 is a schematic diagram of yet another semiconductor structure provided by an embodiment of the disclosure.

In some embodiments, as shown in FIG. 4, the anti-fuse bit structure 250 includes a first electrode 251 connected to the active area 201 through the first connecting structure 221; a second electrode 252 located in a same plane with the first electrode 251, and the plane where the first electrode 251 and the second electrode 252 are located is parallel to the surface of the substrate 200; and an anti-fuse bit dielectric layer 253 located between the first electrode 251 and the second electrode 252 and connected with the first electrode 251 and the second electrode 252, in which the breakdown state is a state in which the anti-fuse bit dielectric layer 253 is broken down, and the non-breakdown state is a state in which the anti-fuse bit dielectric layer 253 is not broken down.

In embodiments of the disclosure, the anti-fuse bit structure 250 includes a first electrode 251, a second electrode 252 and an anti-fuse bit dielectric layer 253. The first electrode 251 and the second electrode 252 are located in a same plane in the second structure layer 220, and the plane where the first electrode 251 and the second electrode 252 are located is parallel to the surface of the substrate 200. The anti-fuse bit dielectric layer 253 is located between and connected with the first electrode 251 and the second electrode 252, so that a capacitor structure that can be broken down is formed. Herein, the first electrode 251 is connected to the active area 201 located in the same selective transistor 240 through the first connecting structure 221 that penetrates the first structure layer 210. In this way, when the voltage difference between the first electrode 251 and the second electrode 252 is greater than or equal to the breakdown voltage of the anti-fuse bit dielectric layer 253, the anti-fuse bit dielectric layer 253 is broken down, that is, the anti-fuse bit structure 250 is permanently broken down, thereby completing a one-time programming operation of the memory cell.

In some embodiments, the first electrode 251 and the second electrode 252 may be made of a conductive material, for example, the material of the first electrode 251 and the second electrode 252 is tungsten (W); the anti-fuse bit dielectric layer 253 may be made of a material such as silicon oxide. It could be understood that the first electrode 251 and the second electrode 252 may be formed simultaneously. For example, trenches corresponding to the first electrode 251 and the second electrode 252 are formed in a same plane by only a single mask process, and then a conductive material is filled in the trenches to form the first electrode 251 and the second electrode 252, thereby simplifying the manufacturing process.

In some embodiments, the projection of the anti-fuse bit structure 250 on the substrate 200 at least partially overlaps the projection of the gate structure 211 on the substrate 200.

In embodiments of the disclosure, as shown in FIG. 4, the projection of the anti-fuse bit structure 250 on the substrate 200 at least partially overlaps the projection of the gate structure 211 on the substrate 200, that is, the anti-fuse bit structure 250 is at least partially located above the gate structure 211, so that the area occupied by the anti-fuse bit structure 250 and the selective transistor 240 in the horizontal direction can be further reduced, and thus the integration of the semiconductor structure can be improved. For example, the second electrode 252 of the anti-fuse bit structure 250 is located above the gate structure 211 to reduce the occupied area in the horizontal direction, and at least part of the first electrode 251 is dislocated with the gate structure 211, so that the first connecting structure 221 can vertically connect the first electrode 251 to the active area 201 beneath the first electrode 251, thereby simplifying the arrangement and manufacturing process of the first connecting structure 221.

Figure 5:
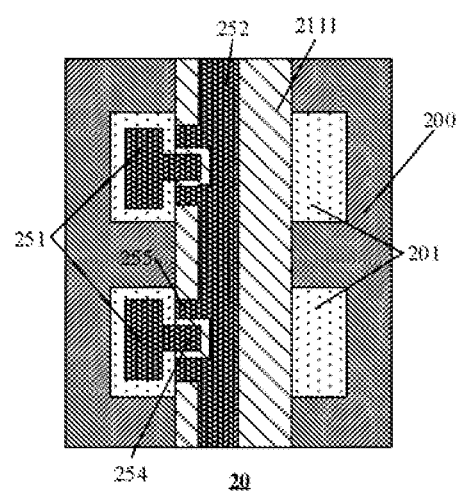
FIG. 5 is a top view of yet another semiconductor structure provided by an embodiment of the disclosure.

In some embodiments, as shown in FIG. 5 as a top view of the semiconductor structure 20, the second electrodes 252 of a plurality of the anti-fuse bit structures 250 located in the extension direction parallel to the gate structure 211 are connected with each other.

In embodiments of the disclosure, the gate electrode 2111 of a gate structure 211 can be a word line in a memory, and the gate structure 211 connects the selective transistors 240 of a plurality of memory cells located in the extension direction thereof. As shown in FIG. 5, the second electrodes 252 of a plurality of the anti-fuse bit structures 250 located in the extension direction parallel to the gate structure 211 are connected with each other. In this way, the gate structure 211 can control the turn-on or turn-off of the selective transistors 240 of the plurality of memory cells located in the extension direction thereof. At this time, applying a suitable voltage to the second electrode 252 can allow the second electrodes 252 of at least a portion of the anti-fuse bit structures 250 in the plurality of memory cells to be pressurized simultaneously, which simplify the operation of the memory. It should be noted that, the second electrodes 251 of the anti-fuse bit structures in a plurality of memory cells located in the extension direction parallel to the gate structure 211 are separated from each other.

In some embodiments, as shown in FIG. 5, the side of the first electrode 251 close to the second electrode 252 has a convex structure 254, and the side of the second electrode 252 close to the first electrode 251 has a concave structure 255 corresponding to the convex structure 254.

In embodiments of the disclosure, the first electrode 251 and the second electrode 252 may not be simple rectangular structures, but may be nested with each other. For example, the concave structure 255 semi-surrounds the convex structure 254. In this way, the convex structure 254 as a tip structure can enhance the surrounding electric field, so that the adjacent anti-fuse bit dielectric layer 253 is more easily broken down, so as to meet the requirement of low energy consumption of semiconductor devices. In addition, the convex structure 254 and the concave structure 255 increase the surface areas of the first electrode 251 and the second electrode 252, thereby allowing the breakdown and the non-breakdown states of the anti-fuse bit structure 250 more stable, and increasing the reliability of reading. It could be understood that, the convex structure 254 and the concave structure 255 may also be of other shapes than that shown in FIG. 5. For example, the first electrode 251 may have multiple convex structures 254 and the second electrode may have multiple concave structures 252, which are nested with each other. The convex structure 254 may also have a shape of tip structure, such as a triangle shape or a zigzag shape.

Figure 6:
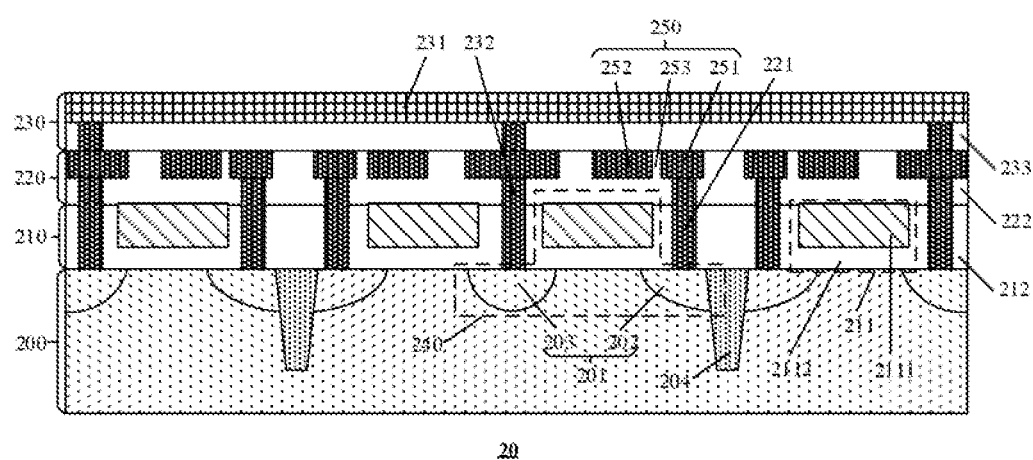
FIG. 6 is a schematic diagram of yet another semiconductor structure provided by an embodiment of the disclosure.
Figure 7:
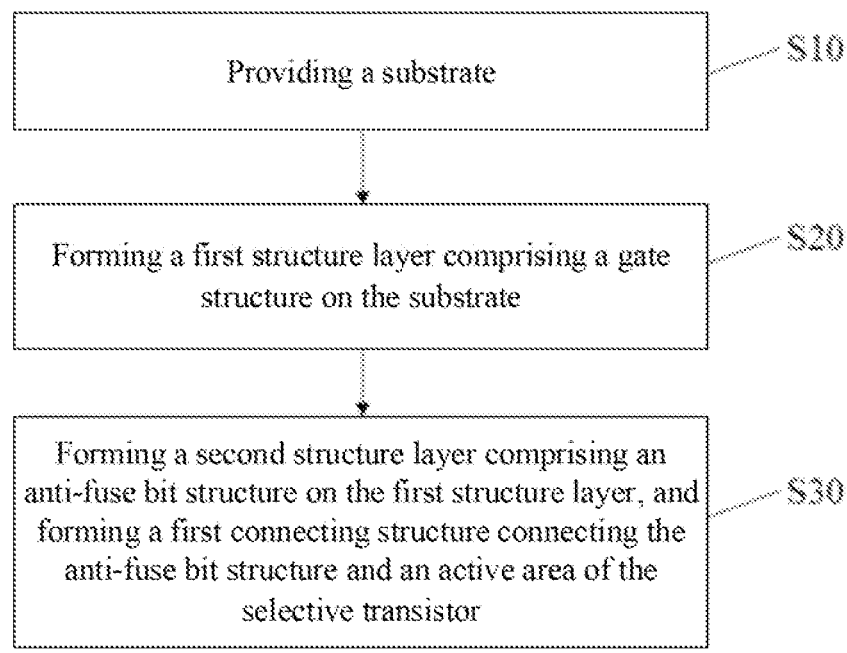
FIG. 7 is a flow chart of a process for forming semiconductor structure provided by an embodiment of the disclosure.

In some embodiments, as shown in FIG. 6, the first structure layer 210 further includes a first isolation layer 212 surrounding at least the bottom surface and the side surfaces of the gate electrode 2111 of the gate structure 211; the second structure layer 220 further includes a second isolation layer 222 surrounding at least the bottom surface and the side surfaces of the anti-fuse bit structure 250; and the first connecting structure 221 penetrates the first isolation layer 212 and the second isolation layer 222.

In embodiments of the disclosure, the first structure layer 210 further includes a first isolation layer 212. The first isolation layer 212 may surround the bottom and the side surfaces of the gate electrode 2111. The second structure layer 220 further includes a second isolation layer 222. The second isolation layer may surround the bottom and the side surfaces of the anti-fuse bit structure 250. Herein, the first isolation layer 212 may be used to isolate the gate electrode 2111 in the first structure layer 210 from the active areas 201 in the substrate 200. The second isolation layer 222 may be used to isolate the anti-fuse bit structure 250 in the second structure layer 220 from the gate electrode 2111 in the first structure layer 210. The materials of the first isolation layer 212 and the second isolation layer 222 respectively include, but are not limited to, silicon oxide ($SiO_2$), spin-on dielectric (SOD), silicon nitride ($Si_3N_4$), silicon oxynitride (SiON), or the like. It could be understood that, the materials and the thicknesses of the first isolation layer 212 and the second isolation layer 222 may be respectively adjusted according to the requirements of the performance of the memory. In some embodiments, the part of the first structure layer 210 other than the gate electrode 2111 is the first isolation layer 212, and the part of the first isolation layer 212 below the gate electrode 2111 may serve as the gate dielectric 2112. In some embodiments, the part of the second structure layer 220 other than the first electrode 251 and the second electrode 252 is the second isolation layer 222, and the part of the second isolation layer 222 between the first electrode 251 and the second electrode 252 may serve as the anti-fuse bit dielectric layer 253. In this way, the manufacturing process can be simplified and the cost can be reduced.

In some embodiments, as shown in FIG. 6, the first isolation layer 212 is an oxide. The part of the first isolation layer 212 in the gate structure 211 serves as the gate dielectric 2112 of the selective transistor 240.

In embodiments of the disclosure, the first isolation, layer 212 is made of an oxide material such as silicon oxide or the like. Herein, the part of the first isolation layer 212 located in the gate structure 211 may serve as the gate dielectric 2112 of the selective transistor 240, In this way the manufacturing process can be simplified and the cost can be reduced. It could be understood that, since the first isolation layer 212 is located in the first structure layer 210 and the first isolation layer 212 may be formed before forming the anti-fuse bit structure 250, a thicker oxide layer may be formed to serve as the first isolation layer 212. In this way, the gate dielectric 2112 of the selective transistor 240 is thicker, so that the programming voltage of the selective transistor 240 is more stable, and the gate dielectric 2112 is not easily broken down by mistake, thereby improving the reliability of the semiconductor device.

In some embodiments, as shown in FIG. 6, the active area 201 includes a first doped region 202 and a second doped region 202 with a same doping type, and the first doped region 202 and the second doped region 203 are respectively located at both sides of the gate structure 211, in which the first doped region 202 is connected with the anti-fuse bit structure 250 through the first connecting structure 211.

In embodiments of the disclosure, the active area 201 may include a first doped region 202 and a second doped region 203 respectively located on both sides of the gate structure 211. The doping types of the first doped region 202 and the second doped region 203 may be the same to serve as the source and the drain of the selective transistor 240. The gate structure 211 is used to control the turn-on or tur-off of the channel between the first doped region 202 and the second doped region 203. For example, the substrate 200 has a P-well, and the first doped region 202 and the second doped region 203 are formed in the P-well, and the first doped region 202 and the second doped region 203 are N-type doped regions or N+-type doped regions, i.e. the selective transistor 240 is an NMOS transistor, which has the advantages such as small on resistance, easy to be manufactured, and the like.

In some embodiments, the semiconductor structure 20 further includes a first metal line 231 located in a third structure layer 230 above the second structure layer 220. The first metal line 231 is connected with the second doped region 203 through a second connecting structure 232. An extension direction, of the first metal line 231 is perpendicular to an extension direction of the gate structure 211.

In embodiments of the disclosure, as shown in FIG. 6, the semiconductor structure 20 further includes a third structure layer 230 located on the second structure layer 220, and a first metal line 231 is provided in the third structure layer 230, where the first metal line 231 may serve as a bit line in the memory. When the selective transistor 240 is turned on, the voltage applied on the first metal line 231 may be applied to the first electrode 251 of the anti-fuse bit structure 250 through the selective transistor 240. At this time, a suitable voltage is applied to the second electrode 252, so that the voltage difference between the first electrode 251 and the second electrode 252 is greater than or equal to the breakdown voltage of the anti-fuse bit dielectric layer 253. Then the anti-fuse bit structure 250 is permanently broken down and the one-time programming operation of the memory cell is completed. The extension direction of the first metal line 231 may be perpendicular to the extension direction of the gate structure 211. That is, the extension direction of the bit line is perpendicular to that of the word line in the memory. Therefore a memory cell can be deposited at an intersection of the extension directions of a bit line and a word line, such that a memory cell array can be formed. In other embodiments, the extension direction of the first metal line 231 intersects the extension direction of the gate structure 211, but is not perpendicular to the extension direction of the gate structure 211. It could be understood that other structures not shown in FIG. 6 may also be included in the third structure layer 230, The first metal line 231 is connected to the second doped region 203 through a second connecting structure 232. Herein, the second connecting structure 232 may be a conductive material such as a metal, a doped semiconductor or the like. For example, the material of the second connecting structure 232 is tungsten.

In some embodiments, the third structure layer 230 further includes a third isolation layer 233 surrounding at least a bottom surface and side surfaces of the first metal line 231.

In embodiments of the disclosure, as shown in FIG. 6, the third structure layer 230 further includes the third isolation layer 233, and the third isolation layer 233 may surround the bottom surface and the side surfaces of the first metal line 231. The third isolation layer 233 is used to isolate the first metal line 231 in the third structure layer 230 from the anti-fuse bit structure 250 in the second structure layer 220, The material of the third isolation layer 233 includes, but is not limited to, silicon oxide, spin-on dielectric, silicon nitride, silicon oxynitride or the like. The second connecting structure 232 penetrates the first isolation layer 212, the second isolation layer 222, and the third isolation layer 233. The material and the thickness of the third isolation layer 233 may be adjusted according to the requirements of the performance of the memory.

In some embodiments, two adjacent ones of the anti-fuse bit structures 250 are symmetrically arranged; and the two selective transistors 240 connected to the symmetrically to arranged two adjacent anti-fuse bit structures 250 share a same second doped region 203.

In embodiments of the disclosure, as shown in FIG. 6, two adjacent anti-fuse bit structures 250 are symmetrically arranged; two selective transistors 240 connected to the symmetrically arranged two adjacent anti-fuse bit structures 250 share the same second doped region 203. In this way, in the one-time programmable memory, two adjacent ones of the memory cells are symmetrically arranged and share one same second doped region 203, so as to reduce the occupied area of each memory cell. In addition, two adjacent ones of the memory cells can be connected to the bit line (the first metal line 231) through one second connecting structure 232, so as to simultaneously perform read and write operations of the two memory cells, thereby improving the operating efficiency of the memory.

In some embodiments, the semiconductor structure 20 further includes an isolation structure 204 located between two adjacent ones of the first doped regions 202, in which the two adjacent first doped regions 202 are the first doped regions 202 corresponding to two adjacent ones of the selective transistors 240 that do not share one second doped region 203.

In embodiments of the disclosure, as shown in FIG. 6, the first doped regions 202 corresponding to two adjacent ones of the selective transistors 240 that do not share one second doped region 203 are close to each other. Thus, it is possible to achieve isolation of the two adjacent selective transistors 240 that does not share one second doped region 203 by providing the isolation structure 204 between the two adjacent first doped regions 202, to prevent the occurrence of a leakage current phenomenon. Herein, the depth of the isolation structure 204 is greater than the doping depth of the first doped regions 202. For example, the isolation structure 204 may be a shallow trench isolation (STI) which has the advantages of low cost, good isolation effect and the like. The material of the isolation structure 204 includes, but is not limited to, silicon oxide or the like.

Figure 8A:
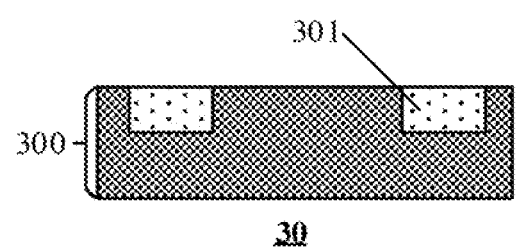
FIG. 8A to 8C are schematic diagrams showing a process for forming a semiconductor structure provided by an embodiment of the disclosure.

As shown in FIG. 7 and FIGS. 8A to 8C, embodiments of the disclosure also provide a method for manufacturing a semiconductor structure 30, the corresponding structure of which is shown in FIGS. 8A to SC, and the method includes the following operations.

In S10, a substrate 300 having a plurality of active areas 301 close to a surface of the substrate 300 is provided. In S20, a first structure layer 310 comprising a gate structure 311 is formed on the substrate 300; and the gate structure 311 and the active areas 301 below the gate structure 311 form a selective transistor 340. In S30, a second structure layer 320 comprising an anti-fuse bit structure 350 is formed on the first structure layer 310, and a first connecting structure 321 connecting the anti-fuse bit structure 350 and an active area 301 of the selective transistor 340 is formed, in which a breakdown state and a non-breakdown state of the anti-fuse bit structure 350 is used to represent different stored data.

As shown in FIG. 8A, the substrate 300 is provided, and the material of the substrate 300 may include an elemental semiconductor material, such as silicon, germanium or the like, or a compound semiconductor material, such as gallium nitride, gallium arsenide, indium phosphide or the like. In some embodiments, the substrate 300 may also have well regions, such as a P-well and a deep N-well, in which the P-well may be used to form the active areas 301 of the selective transistor 340, while the deep N-well may be used to isolate the IP-well and reduce the noise interference to devices formed in the P-well. The active areas 301 may be the doped regions in the substrate 300 and the doping type of a plurality of active areas 301 may be same. For example, the active areas 301 may be N+-type doped regions in the P-well for forming the source and the drain of the selective transistor 340.

Figure 8B:
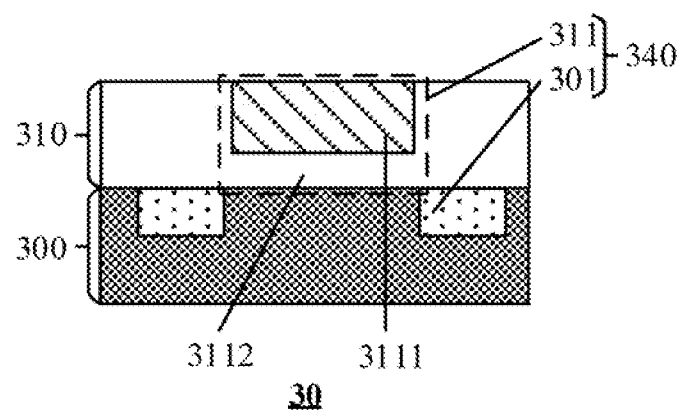

As shown in FIG. 8B, the first structure layer 310 having a gate structure 311 may be formed on the substrate 300 by deposition, photolithography, etching or the like. The gate structure 311 and the active areas 301 below the gate structure 311 constitute a selective transistor 340. The formed gate structure 311 may include a gate electrode 3111 and a gate dielectric 3112, in which the gate electrode 3111 may be a word line in a memory. For example, an insulating material is deposited on the substrate 300 by deposition. The insulating material here may be silicon oxide or other materials. Then a trench corresponding to the gate electrode 311 is formed in the insulating material by lithography and etching, next a gate electrode 3111 is formed by filling a conductive material in the trench by deposition, in which the part of the insulating material below the gate electrode 3111 is the gate dielectric 3112 of the gate structure 311. It could be understood that other structures not shown in FIG. 8B may also be formed in the first structure layer 310. The deposition process used herein includes, but is not limited to, chemical vapor deposition (CVD), atomic layer deposition (ALD) or physical vapor deposition (PVD), The etching process includes, but is not limited to, dry etching and wet etching. Herein, the dry etching may include ion beam milling etching, plasma etching, reactive ion etching, laser ablation, or the like. The wet etching is performed by using a solvent or a solution, such as an acidic or alkaline solution.

Figure 8C:
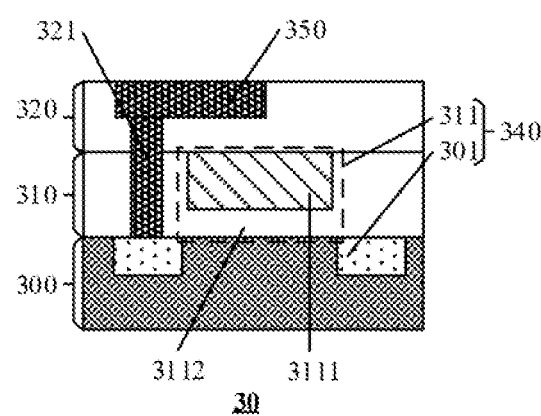

As shown in FIG. 8C, the second structure layer 320 having an anti-fuse bit structure 350 may be formed on the first structure layer 310 by deposition, photolithography, etching and the like, and the first connecting structure 321 connecting the anti-fuse bit structure 350 and an active area 301 of the selective transistor 340 is formed. The formed anti-fuse bit structure 350 is a capacitor structure that can be broken down, and includes two electrodes located in a same plane and an anti-fuse bit dielectric layer located between the two electrodes. For example, an insulating material is deposited on the first structure layer 310 by deposition. The insulating material here may be silicon oxide or other materials. Then, trenches corresponding to the two electrodes of the anti-fuse bit structure 350 and a first connecting hole penetrating the first structure layer 310 and communicating to the active area 301 are formed in the insulating material by photolithography and etching. Next, a conductive material fills in the trenches and the first connecting hole by deposition to form the two electrodes of the anti-fuse bit structure 350 and the first connecting structure 321, and the part of the insulating material between the two electrodes serves as the anti-fuse bit dielectric layer. In some embodiments, the second structure layer 320 having the anti-fuse bit structure 350 may also be formed by self-aligned double patterning (SADP), which can reduce the number of exposures and improve manufacturing efficiency and productivity, A breakdown state and a non-breakdown state of the anti-fuse bit structure 350 are used to represent different stored data, i.e. "0" or "1". It could be understood that other structures not shown in FIG. 8C may also be formed in the second structure layer 320.

Since the anti-fuse bit structure 350 is formed in the second structure layer 320 above the first structure layer 310, that is, the anti-fuse bit structure 350 is formed above the selective transistor 340, in this way, the anti-fuse bit structure 350 does not need to occupy an additional area in the horizontal direction, so that the size of the memory cell is small and the integration of the memory is improved. Furthermore, the two electrodes of the anti-fuse bit structure 350 may be formed simultaneously in the second structure layer 320, that is, fewer mask processes are required, thereby simplifying the manufacturing process. On the other hand, since the gate structure 311 is located in the first structure layer 310, by controlling the etching depth, the gate dielectric 3112 of the gate structure 311 is possibly made thicker, so that the programming voltage of the selective transistor 340 is more stable, and the gate dielectric 3112 is not easily broken down by mistake, thereby improving the reliability of the memory.

Figure 9A:
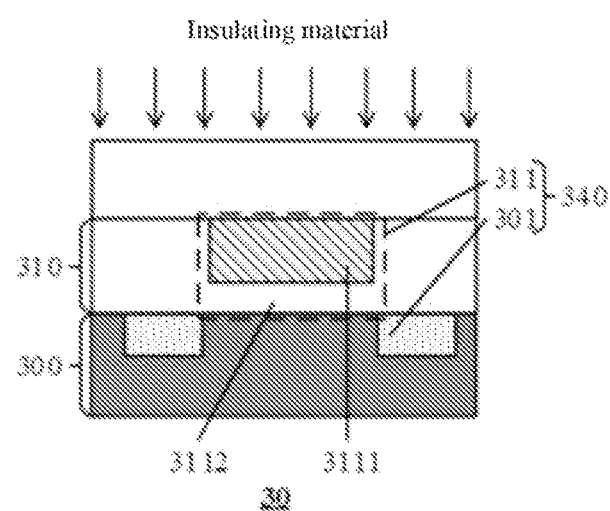
FIG. 9A to 9C are schematic diagrams showing a process for forming an anti-fuse bit structure provided by an embodiment of the disclosure.
Figure 9B:
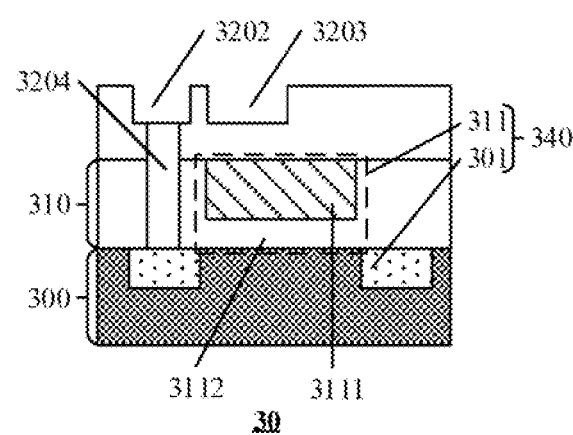
Figure 9C:
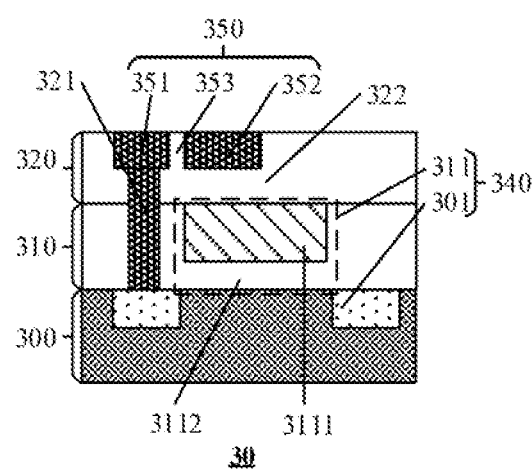

In some embodiments, as shown in FIGS. 9A to 9C, forming the second structure layer 320 having an anti-fuse bit structure 350 on the first structure layer 310 and forming the first connecting structure 321 connecting the anti-fuse bit structure 350 and the active area 301 of the selective transistor 340 includes the following operations. An insulating material is deposited on the first structure layer 30, and the insulating material is used for forming the second isolation layer 322 in the second structure layer 320. The first trench 3202 and the second trench. 3203 are formed in the insulating material, and the first connecting hole 3204 penetrating the first structure layer 310 is formed in the first trench 3202. A conductive material fills in the first connecting hole 3204 to form the first connecting structure 321. A conductive material fills in the first trench 3202 and the second trench 3203 to form a first electrode 351 and a second electrode 352 respectively, in which the insulating material at the location other than the first electrode 351 and the second electrode 352 serves as the second isolation layer 322; the part of the second isolation layer 322 between the first electrode 351 and the second electrode 352 serves as an anti-fuse bit dielectric layer 353 of the anti-fuse bit structure 350; herein, the breakdown state is a state in which the anti-fuse bit dielectric layer 353 is broken down, and the non-breakdown, state is a state in which the anti-fuse bit dielectric layer 353 is not broken down.

As shown in FIG. 9A, an insulating material may be deposited by CVD or the like on the first structure layer 310 on which the gate structure 311 is formed. Optionally, the insulating material here may be silicon oxide, spin-on dielectric, silicon nitride, silicon oxynitride or the like. The insulating material on the first structure layer 310 may be used to from the second isolation layer 322 in the second structure layer 320. The second isolation layer 322 can be used to isolate the anti-fuse bit structure 350 in the second structure layer 320 from the gate electrode 3111 in the first structure layer 210.

As shown in FIG. 9B, the first trench 3202 and the second trench 3203 may be formed in the insulating material by photolithography and etching, and the first connecting hole penetrating the first structure layer 310 is formed in the first trench 3202. Herein, the first trench 3202 and the second trench 3203 are used for forming the first electrode 351 and the second electrode 352, respectively, and the first connecting hole 3204 is used for forming the first connecting structure 321. For example, only a single mask process is used, in which a mask corresponding to the first trench 3202 and the second trench 3203 may be formed on the surface of the insulating material, and then the first trench 3202 and the second trench 3203 are formed simultaneously by etching, and the first connecting hole 3204 penetrating the first structure layer 310 and communicating to the active area 301 is formed in the first trench 3202. The depths of the first trench 3202 and the second trench 3203 may be the same and the depth of both is less than the thickness of the deposited insulating material.

As shown in FIG. 9C, a conductive material may be filled in the first connecting hole 3204 by deposition to form the first connecting structure 321, and a conductive material may be filled in the first trench 3202 and the second trench 3203 to form the first electrode 351 and the second electrode 352, respectively. The conductive material here may be a metal, or may be a doped semiconductor or the like. It could be understood that, the remaining insulating material after forming the first electrode 351 and the second electrode 352 is the second isolation layer 322, and the part of the second isolation layer 22 between the first electrode 351 and the second electrode 352 may serve as the anti-fuse bit dielectric layer 353.

In this way, when the voltage difference between the first electrode 351 and the second electrode 352 is greater than or equal to the breakdown voltage of the anti-fuse bit dielectric layer 353, the anti-fuse bit dielectric layer 353 is broken down, that is, the anti-fuse bit structure 350 is permanently broken-down, thereby completing a one-time programming operation of the memory cell.

In some embodiments, the first electrode 351 and the second electrode 352 may be formed simultaneously by SADP, reducing the number of mask processes required, thereby simplifying the manufacturing process and reducing the manufacturing cost.

FIGS. 10A to 10D are top views of a semiconductor structure 30 during the process of the manufacture. In some embodiments, the extension direction of the first trench 3202 and the second trench 3203 are parallel to the extension direction of the gate structure 311.

Figure 10A:
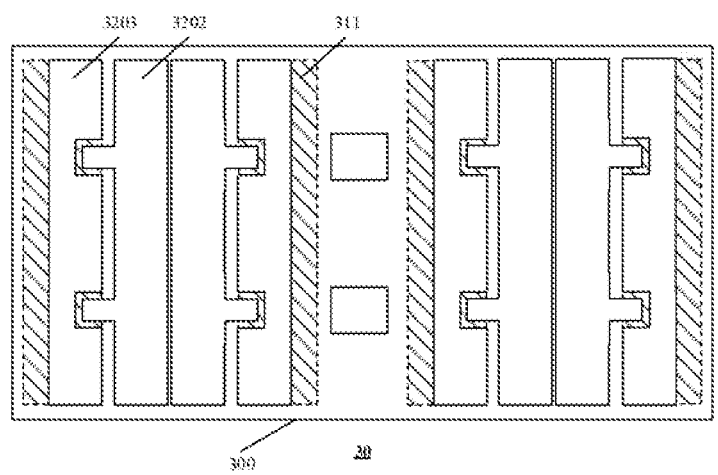
FIG. 10A to 10D are top views showing a process for forming an anti-fuse bit structure provided by an embodiment of the disclosure.

In embodiments of the disclosure, as shown in FIG. 10A, the gate electrode of the gate structure 311 may be a word line of the memory, that is, the extension direction of the first trench 3202 and the second trench 3203 are parallel to the extension direction of the word line. Since the second trench 3203 is used to form the second electrode, the second electrodes of a plurality of anti-fuse bit structures located in the extension direction parallel to the gate structure 311 connected with each other. In this way, the gate structure 311 can control the turn-on or turn-off of the selective transistors of the plurality of memory cells located in the extension direction thereof. At this time, applying a suitable voltage to the second electrodes can allow the second electrodes of at least a portion of the anti-fuse bit structures in the plurality of memory cells to be pressurized simultaneously, which simplify the operation of the memory. It should be noted that a plurality of the first electrodes formed in the first trench 3202 are separated from each other.

In some embodiments, the first trench 3202 and the second trench 3203 may also be formed by self-aligned double patterning, and a conductive material may be filled in the first trench 3202 and the second trench 3203; and then a plurality of first electrodes separated from each other are formed in the first trench 3202 by a subsequent mask process and an etching process.

Figure 10B:
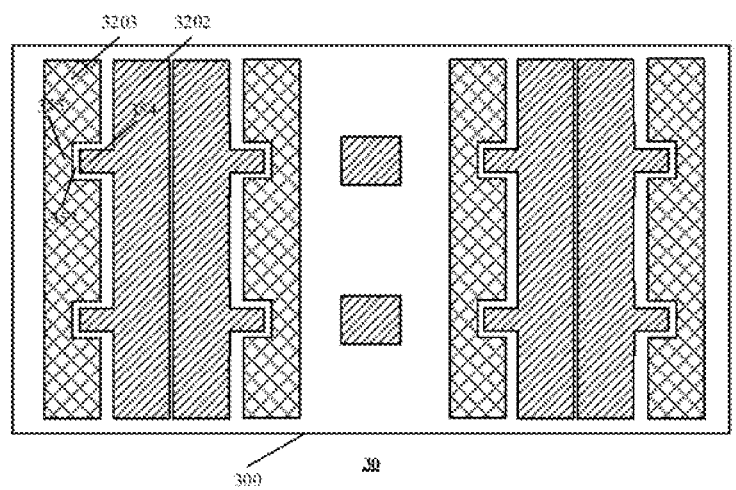

In some embodiments, as shown in FIG. 10B, the first electrode having a convex structure 354 and the second electrode having a concave structure 355 that semi-encloses the convex structure 354 may also be formed by self-aligned double patterning. In this way, the convex structure 354 as a tip structure can enhance the surrounding electric field, so that the adjacent anti-fuse bit dielectric layer 353 is more easily broken down, so as to meet the requirement of low energy consumption of semiconductor devices. In addition, the convex structure 354 and the concave structure 355 increase the surface areas of the first electrode and the second electrode, thereby allowing the breakdown and the non-breakdown states of the anti-fuse bit structure more stable, and increasing the reliability of reading.

Figure 10C:
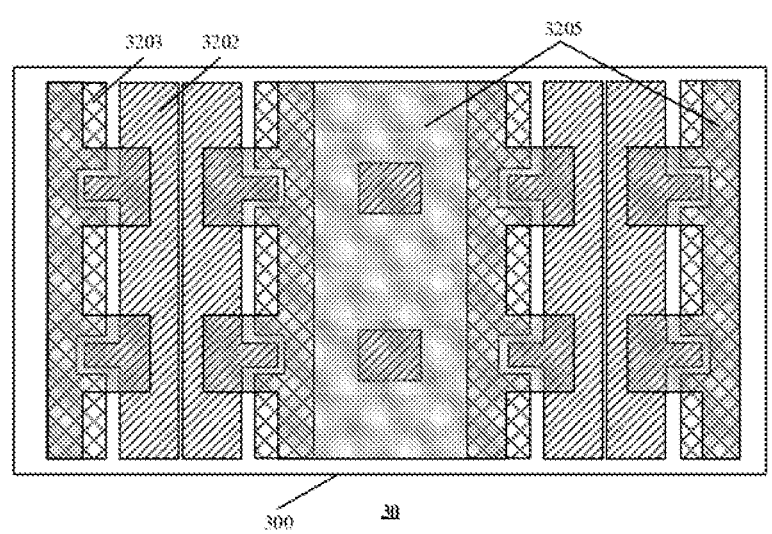
Figure 10D:
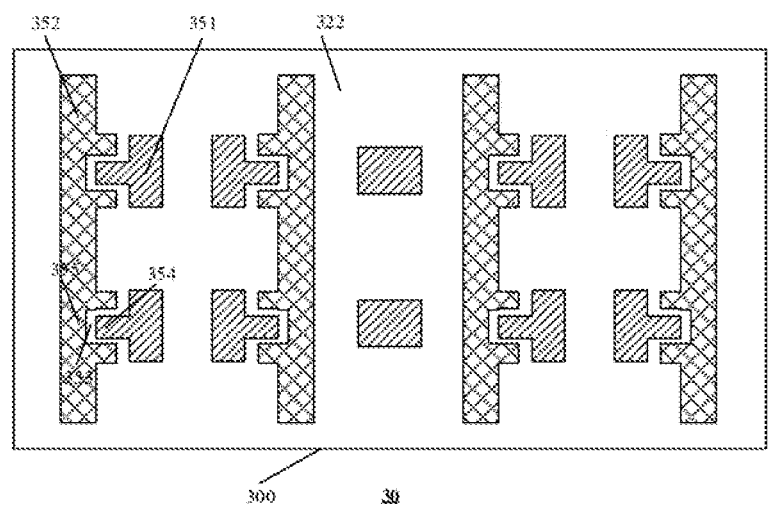

In some embodiments, as shown in FIGS. 10B to 10D, filling a conductive material in the first trench 3202 and the second trench 3203 to form the first electrode 351 and the second electrode 352 respectively includes the following operations. The conductive material is filled in the first trench 3202 and the second trench 3203; and at least part of the conductive material in the first trench 3202 is removed to form a plurality of first electrodes 351 separated from each other and the second electrodes 352 of a plurality of the anti-fuse bit structures 350 in the same line parallel to the extension direction of the gate structure 311 connected with each other. The gate structure 311 is not shown in FIGS. 10B to 10D.

As shown in FIG. 10B, the first trench 3202 and the second trench 3203 may be filled with a conductive material by deposition, in which the conductive material may be a metal, a doped semiconductor or the like. For example, the first trench 3202 and the second trench 3203 is filled with tungsten by deposition to facilitate the formation of the first electrode and the second electrode in a subsequent process.

As shown in FIG. 10C, a mask layer 3205 may be formed on the first trench 3202 and the second trench 3203 that are filled with the conductive material by a process such as photolithography or SADP. The mask layer 3205 may be a hard mask for shielding an area below the hard mask in a subsequent etching process so that the shielded area will not be etched away. For example, a layer of inorganic thin film material, such as SiN, $SiO_2$ or the like, may firstly be formed on the first trench 3202 and the second trench 3203 that are filled with the conductive material by CVD; and then a photoresist is coated on the inorganic thin film material, and an pattern is transferred to the inorganic thin film material by photolithography, to form the mask layer 3205. It could be understood that, the region that is not shielded by the mask layer 3205 is the region to be removed by etching in a subsequent process.

As shown in FIG. 10D, the conductive material in the first trench 3202 and the second trench 3203 is etched through the mask layer, so that at least parts of the conductive material in the first trench 3202 are separated to form a plurality of first electrodes 351 spaced apart from each other, and the second electrodes 352 of a plurality of the anti-fuse bit structures 350 in the same line parallel to the extension direction of the gate structure 311 are connected with each other.

In some embodiments, after the plurality of the separated first electrodes 351 are formed, a part of the conductive material in the first trench 3202 and the second trench 3203 has been removed by etching, and an insulating material may be continuously filled in the first trench 3202 and the second trench 3203 for isolating the plurality of the separated first electrodes 351.

Figure 11:
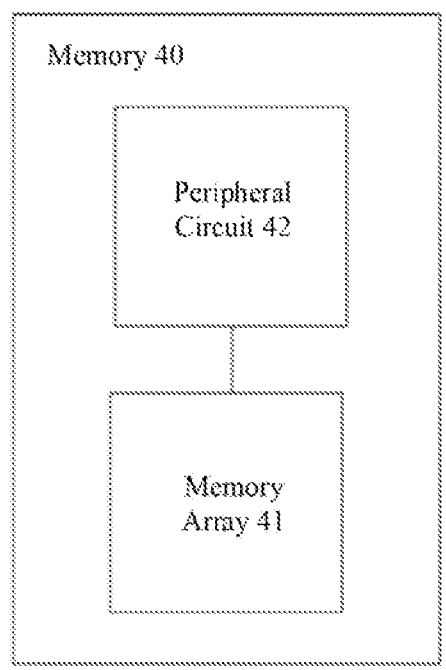
FIG. 11 is a schematic diagram of a memory provided by an embodiment of the disclosure.

As shown in FIG. 11, embodiments of the disclosure also provides a memory 40, which includes a memory array 41 including, the semiconductor structure of any of the above embodiments; and a peripheral circuit 42 coupled to the memory array 41.

In the embodiments of the disclosure, the memory 40 includes a memory array 41 and a peripheral circuit 42 coupled to the memory array 41. Herein, the memory array 41 includes the semiconductor structure as described in any of the above-described embodiments. The peripheral circuit 42 includes an address circuit for latching and decoding row/column address information, a sensing circuit for monitoring and judging information stored in an anti-fuse unit, and a control circuit for switching an operation mode. In this way, the anti-fuse bit structure occupies a smaller area so that the size of the memory cell is small and the integration of the memory 40 is improved. In addition, the number of mask processes required to form the anti-fuse bit structure is less, thereby simplifying the manufacturing process of the memory 40. On the other hand, the gate dielectric may be made thicker, thereby allowing the programing voltage of the selective transistor more stable and improving the reliability of the memory 40.

Figure 12:
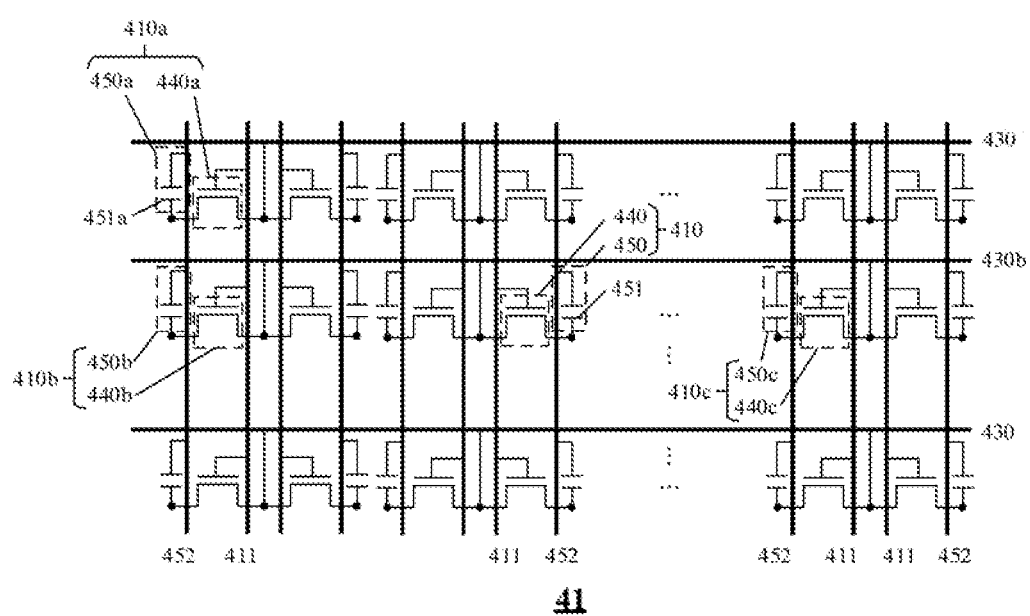
FIG. 12 is a schematic diagram of a memory array in a memory provided by an embodiment of the disclosure.

FIG. 12 is a schematic diagram of a memory array 41, in which a selective transistor 440 and an anti-fuse bit structure 450 form a memory cell 410, each word line 411 and each second electrode 452 are connected to a plurality of memory cells 410 in their extending direction, and a first metal line 430 (bit line) is connected to two adjacent ones of the memory cells 410 sharing a source or a drain.

Embodiments of the disclosure also provide a method for operating the memory 40, the memory 40 including the semiconductor structure of any of the above embodiments. The method includes: breaking down one target anti-fuse bit structure 450 of the anti-fuse bit structures 450 of the memory 40 according to data to be written, so that the target anti-fuse bit structure 450 is of a breakdown state converted from a non-breakdown state, and maintaining a non-breakdown state of non-target anti-fuse bit structures 450, in which the non-target anti-fuse bit structures 450 are anti-fuse bit structures 450 other than the target anti-fuse bit structure 450.

In embodiments of the disclosure, referring to FIG. 12, a method for operating a memory 40 includes: when a write operation is performed on a target memory cell, the target anti-fuse bit structure 450 in the memory array 41 is broken down according to data to be written to convert the target anti-fuse bit structure 450 from a non-breakdown state to a breakdown state; and a non-breakdown state of a non-target anti-fuse bit structure 450 in a non-target memory cell maintains. The non-target anti-fuse bit structure 450 here is an anti-fuse bit structure 450 other than the target anti-fuse bit structure 450.

For example, different voltages are applied to the first electrode 451 and the second electrode 452 such that a voltage difference between them is greater than or equal to the breakdown voltage Vblow, thereby achieving the breakdown of the anti-fuse bit structure 450. If the voltage difference between the two electrodes is less than the breakdown voltage Vblow, the non-breakdown state of the anti-fuse bit structure 450 maintains.

The method for operating the memory 40 is explained below according to the operation voltage shown in Table 1 and referring to FIG. 12. Herein, the non-target memory cell 410a are connected to the same word line and the same second electrode; and the non-target memory cell 410c and the target memory cell 410a are not connected to any of the same word line, the same second electrode or the same bit line.

TABLE 1

Operation voltage of memory 40

|  | First metal line 430 | Word line 411 | Second electrode 452 |
| --- | --- | --- | --- |
| Target memory cell 410a | V2 | V1 | V3 |
| Non-target memory cell 410b | V4 | V1 | V3 |
| Non-target memory cell 410c | — | V5 | — |

In some embodiments, breaking down one target anti-fuse bit structure 450a in the anti-fuse bit structures 450 of the memory 40 to convert the target anti-fuse bit structure 450a from a non-breakdown state to a breakdown state includes the following operations. A first voltage V1 is applied to the gate structure of the selective transistor 440a to which the target anti-fuse bit structure 450a is connected, to turn on the selective transistor 440a. A second voltage V2 is applied to the first metal line 430 connected to the selective transistor 440a, and the second voltage V2 is applied to the first electrode 451a of the target anti-fuse bit structure 450a through the selective transistor 440a. A third voltage V3 is applied to the second electrode 452 of the target anti-fuse bit structure 450a to convert the target anti-fuse bit structure 450a from a non-breakdown state to a breakdown state, in which a voltage difference between the second voltage V2 and the third voltage V3 is greater than or equal to a breakdown voltage of the anti-fuse bit structure 450.

In embodiments of the disclosure, the target anti-fuse bit structure 450a in the target memory cell 410a is broken down to realize written of data. Specifically, as shown in FIG. 12, the first voltage V1 is applied to the gate structure of the selective transistor 440a to which the target anti-fuse bit structure 450a is connected, i.e. the first voltage V1 is applied to the word line 411. Optionally, the first voltage V1 herein may be greater than ½ of the breakdown voltage Vblow to ensure the turn-on of the selective transistor 440a. At the same time, the second voltage V2 is applied to the first metal line 430 to which the selective transistor 440a is connected, and the third voltage V3 is applied to the second electrode 452 of the target anti-fuse bit structure 450a. As such, the second voltage V2 is applied to the first electrode 451a of the target anti-fuse bit structure 450a by turning on the selective transistor 440a, and the voltage difference between the second voltage V2 and the third voltage V3 is greater than or equal to the breakdown voltage Vblow to convert the target anti-fuse bit structure 450a from the non-breakdown state to the breakdown state. Optionally, the second voltage V2 herein may be 0 V, and the third voltage V3 may be the breakdown voltage Vblow.

In some embodiments, maintaining the non-breakdown state of the non-target anti-fuse bit structures 450b includes the following operations. A first voltage V1 is applied to the gate structure of the selective transistor 440b to which the non-target anti-fuse bit structure 450b is connected, to turn on the selective transistor 440b. A fourth voltage V4 is applied to the first metal line 430b to which the selective transistor 440b is connected, and the fourth voltage V4 is applied to the first electrode 451b of the non-target anti-fuse bit structure 450b through the selective transistor 440b. A third voltage V3 is applied to the second electrode 452 of the non-target anti-fuse bit structure 450b to maintain the non- 410a is broken down. Specifically, as shown in FIG. 12, since the non-target memory cell 410c and the target memory cell 410a are not connected to a same word line 411 or a same first metal line 430, the non-breakdown state of the non-target anti-fuse bit structure 450c can be maintained only by turning off the selective transistor 440c. Specifically, the fifth voltage V5 is applied to the gate structure (the word line 411) of the selective transistor 440c to which the non-target anti-fuse bit structure 450c is connected, to turn off the selective transistor 440c, so that the non-target anti-fuse bit structure 450c remains in the non-breakdown state. Optionally, the fifth voltage V5 here may be 0V,

TABLE 2

| | Operation voltage of memory 40 | | | | | | |
|---|---|---|---|---|---|---|---|
| | First metal line | | Gate structure | | Second electrode | | Well |
| Object Type | Target memory cell | Non-target memory cell | Target memory cell | Non-target memory cell | Target memory cell | Non-target memory cell | region None |
| Write | 0 V | ½Vblow | >½Vblow | 0 V | Vblow | ½Vblow | 0 V |
| read | Vblr | 0 V | Vwlr | 0 V | 0 V | 0 V | 0 V | breakdown state of the non-target anti-fuse bit structure 450b. Herein a voltage difference between the fourth voltage V4 and the third voltage V3 is smaller than the breakdown voltage of the anti-fuse bit structure 450.

In the embodiments of the disclosure, it is also necessary to maintain the non-breakdown state of the non-target anti-fuse bit structure 450b in the non-target memory cell 410b when the target anti-fuse structure 450a in the target memory cell 410a is broken down. Specifically, as shown in FIG. 12, for a non-target memory cell 410b connected to the same word line 411 and the same second electrode 452 as the target memory cell 410a, since the first voltage V1 is applied to the gate structure of the selective transistor 440b to which the non-target anti-fuse bit structure 450b is connected, that is, the word line 411, and the selective transistor 440b is turned on, it is necessary to ensure that the voltage difference between the first electrode 451b and the second electrode 452 of the non-target anti-fuse bit structure 450b is smaller than the breakdown voltage Vblow. Therefore, a fourth voltage V4 is applied to the first metal line 430b to which the selective transistor 440b is connected. In this way, the fourth voltage V4 is applied to the first electrode 451b of the non-target anti-fuse bit structure 450b through the turn-on selective transistor 440b, and the voltage difference between the third voltage V3 on the second electrode 452 and the fourth voltage V4 on the first electrode 451b is smaller than the breakdown voltage Vblow to maintain the non-breakdown state of the non-target anti-fuse bit structure 450, Optionally, the third voltage V3 here may be the breakdown voltage Vbelow, and the fourth voltage V4 may be ½ of Vbelow.

In some embodiments, maintaining the non-breakdown state of the non-target anti-fuse bit structures includes: applying a fifth voltage V5 to the gate structure of the selective transistor 440c to which the non-target anti-fuse bit structure 450c is connected, to turn off the selective transistor 440c, so that the non-target anti-fuse bit structure remains in a non-breakdown state.

In the embodiments of the disclosure, it is necessary to maintain the non-breakdown state of the non-target anti-fuse bit structure 450c in the non-target memory cell 410c when the target anti-fuse structure 450a in the target memory cell In some embodiments, the memory 40 may also be written and read in accordance with the operation voltages as shown in Table 2. Herein, Vblr is the read voltage of the first metal line 430, i.e. the bit line; Vwlr is the read voltage of the word line 411.

It should be noted that, the features disclosed in the embodiments of several methods or devices provided in the disclosure can be arbitrarily combined as long as there is no conflict therebetween to obtain a new embodiment of a method or a device. The descriptions above are only some specific embodiments of the present disclosure, and are not intended to limit the scope of protection of the embodiments of the present disclosure. Any change or replacement is easily to conceive of within the technical scope of the embodiments of the present by those skilled in the art, and fall with the protection scope of the present disclosure. Therefore, the scope of protection of the embodiments of the present disclosure shall be subject to the scope of protection of the claims.

INDUSTRIAL PRACTICALITY

In the semiconductor structure provided by the embodiments of the disclosure, the gate stricture is located at the first structure layer on the substrate, the anti-fuse bit structure is located at the second structure layer on the first structure layer, and the anti-fuse bit structure is connected to the active area in the substrate through the first connecting structure. In this way, the anti-fuse bit structure does not need to occupy an additional area in the horizontal direction, the integration of the memory is improved, and the number of mask processes required to form the anti-fuse bit structure is reduced, thereby simplifying the manufacturing process.

What is claimed is:
1. A semiconductor structure, comprising:
 a substrate having a plurality of active areas close to a surface of the substrate;
 a gate structure located in a first structure layer on the substrate, the gate structure and the active areas forming a selective transistor; and
 an anti-fuse bit structure located in a second structure layer on the first structure layer, and being connected with an active area of one selective transistor through a first connecting structure, a breakdown state and a non-breakdown state of the anti-fuse bit structure representing different stored data; and wherein the anti-fuse bit structure comprises:
a first electrode connected to the active area through the first connecting structure;
a second electrode located in a same plane with the first electrode, the plane where the first electrode and the second electrode are located being parallel to the surface of the substrate; and
an anti-fuse bit dielectric layer located between the first electrode and the second electrode and connected with the first electrode and the second electrode, wherein the breakdown state is a state in which the anti-fuse bit dielectric layer is broken down, and the non-breakdown state is a state in which the anti-fuse bit dielectric layer is not broken down.

2. The semiconductor structure of claim 1, wherein the second electrodes of a plurality of anti-fuse bit structures are located in an extension direction parallel to the gate structure and connected with each other.

3. The semiconductor structure of claim 1, wherein a side of the first electrode close to the second electrode has a convex structure, and a side of the second electrode close to the first electrode has a concave structure corresponding to the convex structure.

4. The semiconductor structure of claim 1, wherein a projection of the anti-fuse bit structure on the substrate at least partially overlaps a projection of the gate structure on the substrate.

5. The semiconductor structure of claim 1, wherein the first structure layer further comprises a first isolation layer surrounding at least a bottom surface and side surfaces of a gate electrode of the gate structure; and
the second structure layer further comprises a second isolation layer surrounding at least a bottom surface and side surfaces of the anti-fuse bit structure, and the first connecting structure penetrates the first isolation layer and the second isolation layer.

6. The semiconductor structure of claim 5, wherein the first isolation layer is an oxide material, wherein a part of the first isolation layer in the gate structure serves as a gate dielectric of the selective transistor.

7. The semiconductor structure of claim 1, wherein the active area comprises:
a first doped region and a second doped region which are of a same doping type, the first doped region and the second doped region being respectively located at two sides of the gate structure; wherein,
the first doped region is connected with the anti-fuse bit structure through the first connecting structure.

8. The semiconductor structure of claim 7, further comprising:
a first metal line located in a third structure layer above the second structure layer;
wherein the first metal line is connected with the second doped region through a second connecting structure, an extension direction of the first metal line is perpendicular to an extension direction of the gate structure.

9. The semiconductor structure of claim 8, wherein the third structure layer further comprises a third isolation layer surrounding at least a bottom surface and side surfaces of the first metal line.

10. The semiconductor structure of claim 7, further comprising:
two selective transistors sharing the same second doped region, each selective transistor connected to a different anti fuse bit structure, two anti fuse bit structures symmetrically disposed in connection with the two selective transistors sharing the same second doped region.

11. The semiconductor structure of claim 10, further comprising:
an isolation structure and two selective transistors located on opposite sides of the isolation structure, wherein the two selective transistors located on opposite sides of the isolation structure do not share the same second doped region and are in contact with the same isolation structure through the first doped region.

12. A memory, comprising:
a memory array comprising the semiconductor structure according to claim 1; and
a peripheral circuit coupled to the memory array.

13. A method for manufacturing a semiconductor structure, comprising:
providing a substrate having a plurality of active areas close to a surface of the substrate;
forming a first structure layer comprising a gate structure on the substrate, the gate structure and the active areas constituting a selective transistor; and
forming a second structure layer comprising an anti-fuse bit structure on the first structure layer, and forming a first connecting structure connecting the anti-fuse bit structure and an active area of the selective transistor, a breakdown state and a non-breakdown state of the anti-fuse bit structure representing different stored data; and
wherein forming the second structure layer comprising the anti-fuse bit structure on the first structure layer and forming the first connecting structure connecting the anti-fuse bit structure and the active areas of the selective transistor comprises:
depositing an insulating material on the first structure layer, the insulating material being used for forming a second isolation layer in the second structure layer;
forming a first trench and a second trench in the insulating material, and forming a first connecting hole in the first trench, penetrating the first structure layer;
filling a conductive material in the first connecting hole to form the first connecting structure; and
filling a conductive material in the first trench and the second trench to form a first electrode and a second electrode, respectively, the insulating material at a location other than the first electrode and the second electrode serving as the second isolation layer, part of the second isolation layer between the first electrode and the second electrode serving as an anti-fuse bit dielectric layer of the anti-fuse bit structure, wherein the breakdown state is a state in which the anti-fuse bit dielectric layer is broken down, and the non-breakdown state is a state in which the anti-fuse bit dielectric layer is not broken down.

14. The method according to claim 13, wherein an extension direction of the first trench and the second trench are parallel to an extension direction of the gate structure.

15. The method according to claim 14, wherein filling the conductive material in the first trench and the second trench to form the first electrode and the second electrode, respectively comprises:
filling the conductive material in the first trench and the second trench; and
removing at least part of the conductive material in the first trench to form a plurality of the first electrodes separated from each other and the second electrodes of a plurality of the anti-fuse bit structures in a same line parallel to an extension direction of the gate structure connected with each other.

16. A method for operating a memory comprising the semiconductor structure according to claim 1, comprising
breaking down a target anti-fuse bit structure in the anti-fuse bit structures of the memory according to data to be written to convert the target anti-fuse bit structure from a non-breakdown state to a breakdown state; and
maintaining a non-breakdown state of a non-target anti-fuse bit structure, wherein the non-target anti-fuse bit structure is an anti-fuse bit structure other than the target anti-fuse bit structure; and
wherein breaking down the target anti-fuse bit structure in the anti-fuse bit structures of the memory to convert the target anti-fuse bit structure from the non-breakdown state to the breakdown state comprises:
applying a first voltage to the gate structure of the selective transistor to which the target anti-fuse bit structure is connected to turn on the selective transistor;
applying a second voltage to the first metal line to which the selective transistor is connected; and
applying a third voltage to the second electrode of the target anti-fuse bit structure to convert the target anti-fuse bit structure from the non-breakdown state to the breakdown state, wherein a voltage difference between the second voltage and the third voltage is greater than or equal to a breakdown voltage of the anti-fuse bit structure.

17. The method of claim 16, wherein,
maintaining the non-breakdown state of the non-target anti-fuse bit structure comprises:
applying a first voltage to the gate structure of the selective transistor to which the non-target anti-fuse bit structure is connected to turn on the selective transistor;
applying a third voltage to the first metal line to which the selective transistor is connected; and
applying a second voltage to the second electrode of the non-target anti-fuse bit structure to maintaining the non-breakdown state of the non-target anti-fuse bit structure, wherein a voltage difference between the third voltage and the second voltage is smaller than the breakdown voltage of the anti-fuse bit structure,
alternatively, maintaining the non-breakdown state of the non-target anti-fuse bit structure comprises:
applying a fourth voltage to the gate structure of the selective transistor to which the non-target anti-fuse bit structure is connected to turn off the selective transistor, and the non-target anti-fuse bit structure maintains in the non-breakdown state.

* * * * *